United States Patent
Ozawa et al.

(10) Patent No.: US 6,801,098 B2
(45) Date of Patent: Oct. 5, 2004

(54) GROUP DELAY EQUALIZER INTEGRATED WITH A WIDEBAND DISTRIBUTED AMPLIFIER MONOLITHIC MICROWAVE INTEGRATED CIRCUIT

(75) Inventors: Kazuya Ozawa, Atsugi (JP); Saphan Yok, Rowlett, TX (US); Stephen R. Nelson, Springfield, MO (US)

(73) Assignee: Remec, INC, Del Mar, CA (US)

( * ) Notice: Subject to any disclaimer, the term of this patent is extended or adjusted under 35 U.S.C. 154(b) by 168 days.

(21) Appl. No.: 10/061,716

(22) Filed: Jan. 31, 2002

(65) Prior Publication Data

US 2003/0141941 A1 Jul. 31, 2003

(51) Int. Cl.[7] .............................. H03H 5/00; H03F 3/68
(52) U.S. Cl. ................................. 333/28 R; 330/124 R
(58) Field of Search ...................... 333/28 R; 330/124 R (56) References Cited

U.S. PATENT DOCUMENTS

| | | | |
|---|---|---|---|
| 3,582,804 A | 6/1971 | Beck ............................ 330/54 |
| 3,609,599 A | 9/1971 | Standley ................... 333/28 R |
| 3,699,480 A | 10/1972 | Mueller ........................ 333/28 |
| 3,737,808 A | 6/1973 | Srivastava .................... 333/20 |
| 4,443,772 A | 4/1984 | Schwarzmann .............. 333/28 |
| 4,491,808 A | 1/1985 | Saito ............................ 333/28 |
| 4,730,342 A | 3/1988 | Saito ............................ 375/12 |
| 4,845,440 A | 7/1989 | Aitchison .................... 330/277 |
| 4,876,516 A | 10/1989 | Dougherty .................... 330/54 |
| 4,947,136 A | 8/1990 | Helms .......................... 330/54 |
| 4,994,755 A * | 2/1991 | Titus et al. .................... 330/54 |
| 5,004,991 A | 4/1991 | Teleki et al. ................ 333/168 |
| 5,012,203 A | 4/1991 | Beyer et al. ................ 330/286 |
| 5,070,304 A * | 12/1991 | Salib et al. .................... 330/54 |
| 5,087,898 A * | 2/1992 | Pyndiah et al. ........... 333/24 R |
| 5,721,756 A | 2/1998 | Liebetreu et al. ........... 375/344 |
| 6,191,735 B1 * | 2/2001 | Schineller .................... 342/375 |

OTHER PUBLICATIONS

PCT: Notification of Transmittal of the International Search Report dated Sep. 5, 2003.

* cited by examiner

Primary Examiner—Patricia Nguyen
(74) Attorney, Agent, or Firm—Jenkens & Gilchrist (57) ABSTRACT

A wideband distributed or feedback amplifier monolithic microwave integrated circuit (MMIC) is disclosed that contains an integrated group delay equalizer circuit to compensate for the group delay variation of the amplifier circuitry. The MMIC amplifier is capable of achieving a predicted constant group delay with little variation over a wide frequency range. In addition, the group delay equalizer circuit enables the amplifier to achieve flat (constant) gain over a wide bandwidth, while maintaining constant group delay. Furthermore, the group delay equalizer circuitry requires only a small portion of the total MMIC area.

30 Claims, 10 Drawing Sheets

GROUP DELAY EQUALIZER INTEGRATED WITH A WIDEBAND DISTRIBUTED AMPLIFIER MONOLITHIC MICROWAVE INTEGRATED CIRCUIT

BACKGROUND OF THE INVENTION

1. Field of the Invention

The present invention relates generally to distributed amplifier monolithic microwave integrated circuits (MMIC's), and specifically to group delay equalizer circuits for distributed amplifier MMIC's.

2. Description of Related Art

As is well-known in the art, electromagnetic waves of different frequencies experience different time delays when transmitted through a transmission system. For example, when a broadband microwave signal is transmitted through a waveguide, the lower frequency components are delayed to a different extent than the higher frequency components. If uncorrected, this difference in time delay may give rise to appreciable distortion of the signal.

The time delay present in a circuit is known as the group delay of the circuit. Group delay is a measure of the rate of change (derivative) of amplifier phase versus frequency. Group delay remains constant over a frequency range if the insertion phase (phase shift) changes linearly with frequency. For example, time delay ($\tau$) and phase shift ($\Phi$) at a given frequency ($f$) are related by the following equation:

$$\tau = \Phi/(2\pi f),$$

where $f$ is the fundamental frequency of a waveform, and $\Phi$ is phase in radians. If the phase shift increases linearly with frequency, the time delay is constant and identical at all frequency components of a complex waveform, and thus the group delay is constant. However, if the phase shift does not increase linearly with frequency, the time delay varies with frequency, and thus the group delay is not constant over all frequencies.

Group delay variation versus frequency is an important performance parameter in next-generation high speed, high data rate (e.g., data rates up to at least 40 Gbit/s) optical fiber data links and electro-optics hardware. Optical systems have frequently utilized distributed amplifiers or feedback amplifiers to amplify a digital signal for transmission over long distances. Although such previous optical systems have experienced problems resulting from group delay variation within the amplifier itself, with higher data rates (40 Gbit/s and higher) that produce short data pulses, any group delay variation within the amplifier itself may result in distortion of the data pulse. Since a short data pulse representing digital data (0 or 1) has a broad power spectrum in the frequency domain, covering a wide bandwidth, in order to transmit a short pulse over long distances with low distortion in pulse shape and pulse width, the frequency—power spectrum of the pulse must be able to be amplified over a wide frequency range with a uniform, constant delay at any given frequency.

A typical approach to designing an amplifier (e.g., a distributed amplifier) to achieve near constant group delay versus frequency involves monotonically rolling off the gain of the amplifier from low to high frequency, following various filter or polynomial equation characteristics. For example, such amplifiers may have 15 dB gain at low frequencies, decreasing to 12 dB gain at 20 GHz, and to 8 or 9 dB gain at 40 GHz. Although this enables low distortion pulse amplification, the gain rolloff severely restricts the application of the amplifier to other applications, for instance, wideband test equipment, or radios, where constant gain versus frequency amplification is preferred.

Another approach to providing near constant group delay versus frequency for a distributed amplifier involves connecting the distributed amplifier to external group delay equalizer circuitry. The external group delay equalizer circuitry flattens the overall group delay characteristic of the cascade of the amplifier and the group delay equalizer. However, the external group delay equalizer, typically fabricated as a thin-film network, may be larger than the distributed amplifier monolithic microwave integrated circuit, which adds loss to the overall circuit, thereby reducing the overall amplifier gain. In addition, the increased area of the overall circuit due to the external group delay equalizer is also a disadvantage for densely packed transceivers.

SUMMARY OF THE INVENTION

A wideband distributed amplifier monolithic microwave integrated circuit (MMIC) is disclosed that contains an integrated group delay equalizer circuit to compensate for the group delay variation of the distributed amplifier circuitry. The MMIC amplifier is capable of achieving a predicted constant group delay with little variation over a broad frequency range. In addition, the group delay equalizer circuit enables the distributed amplifier to achieve flat (constant) gain over a wide bandwidth, while maintaining constant group delay. Advantageously, the group delay equalizer circuitry requires only a small portion of the total MMIC area.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS OF THE INVENTION

The numerous innovative teachings of the present application will be described with particular reference to the exemplary embodiments. However, it should be understood that these embodiments provide only a few examples of the many advantageous uses of the innovative teachings herein. In general, statements made in the present application do not necessarily delimit any of the various claimed inventions. Moreover, some statements may apply to some inventive features, but not to others.

Figure 1:
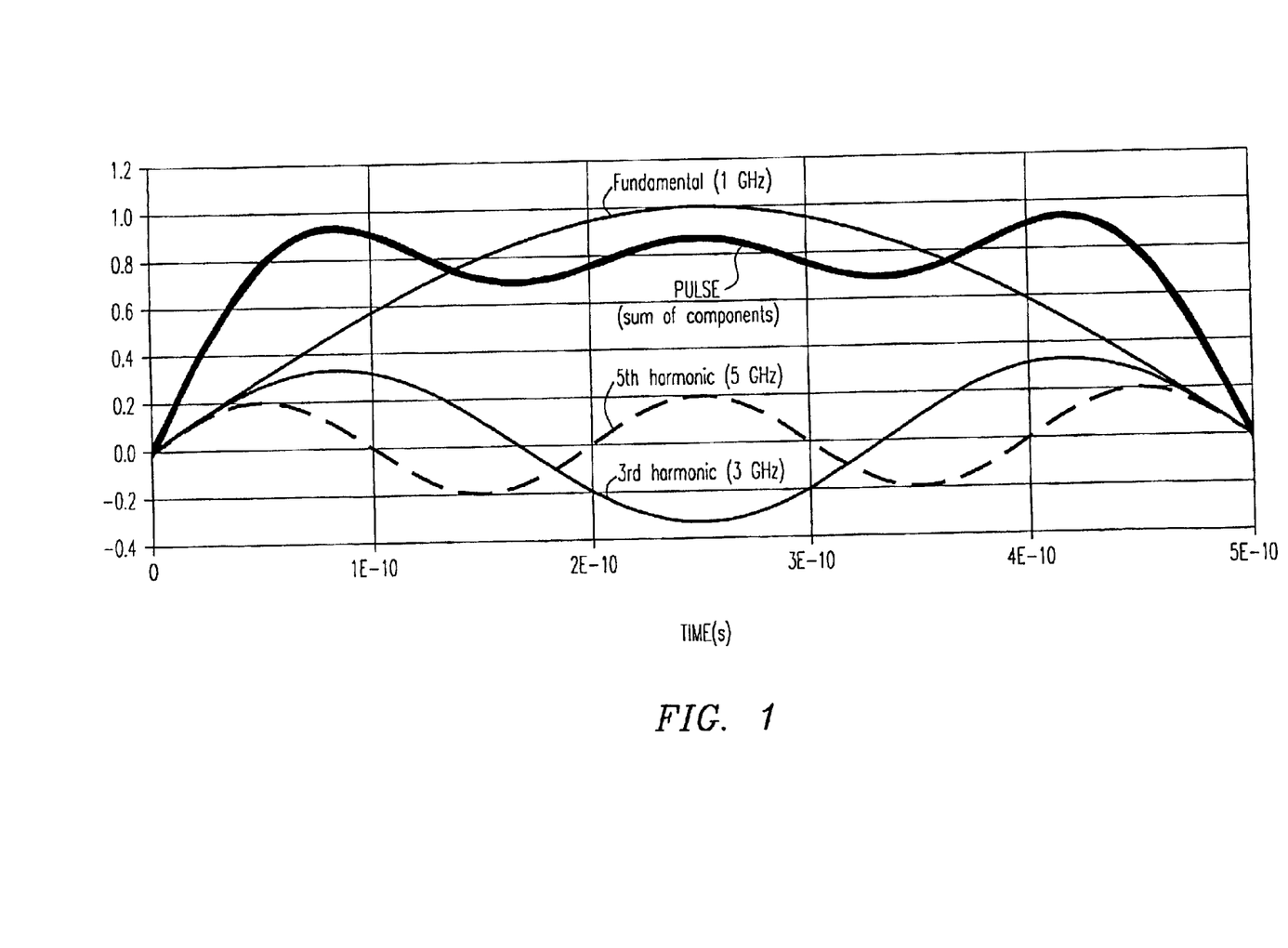
FIG. 1 is a graphical representation of a pulse having three different frequency components.

As is understood in the art, a digital pulse is made up of multiple frequency components. If all frequency components are not delayed by the same amount within a circuit, the resulting output signal will be distorted. For example, a near square pulse that is made up of a fundamental carrier at 1 GHz and two harmonics, the $3^{rd}$ (3 GHz) and $5^{th}$ (5 GHz) harmonics, is shown in FIG. 1. As shown in FIG. 1, when the frequency components sum with constant (same) group delay for each, the resultant waveform is a near square pulse.

Figure 2:
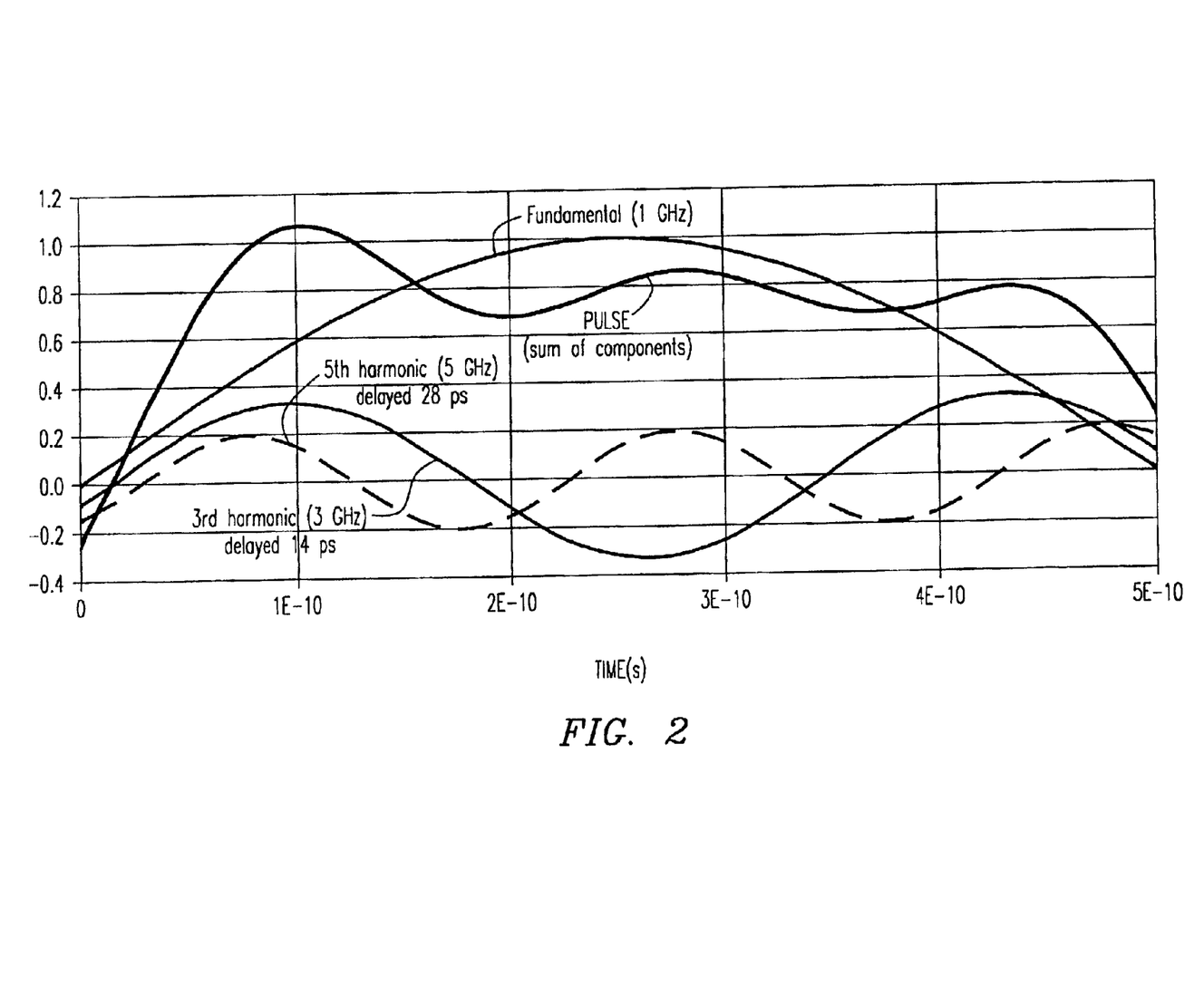
FIG. 2 illustrates the distortion in the pulse of FIG. 1 when the different frequency components have different time delays.

However, if, as is shown in FIG. 2, the fundamental signal is delayed by x ps, the $3^{rd}$ harmonic signal is delayed by x+14 ps and the $5^{th}$ harmonic signal is delayed by x+28 ps, the resulting sum of the three components is not a near square pulse. Instead, the waveform is distorted, with the rising edge of the pulse overshooting, and the falling edge region of the pulse having a lower amplitude. This is the type of delay-created pulse distortion that may become problematic with distributed amplifiers in next-generation high speed, high data rate (e.g., 40 Gbit/s and higher) electro-optics systems. If the distortion in the pulse becomes even more severe, a receiver may confuse a pulse "1" with "0", or vice versa.

Figure 3:
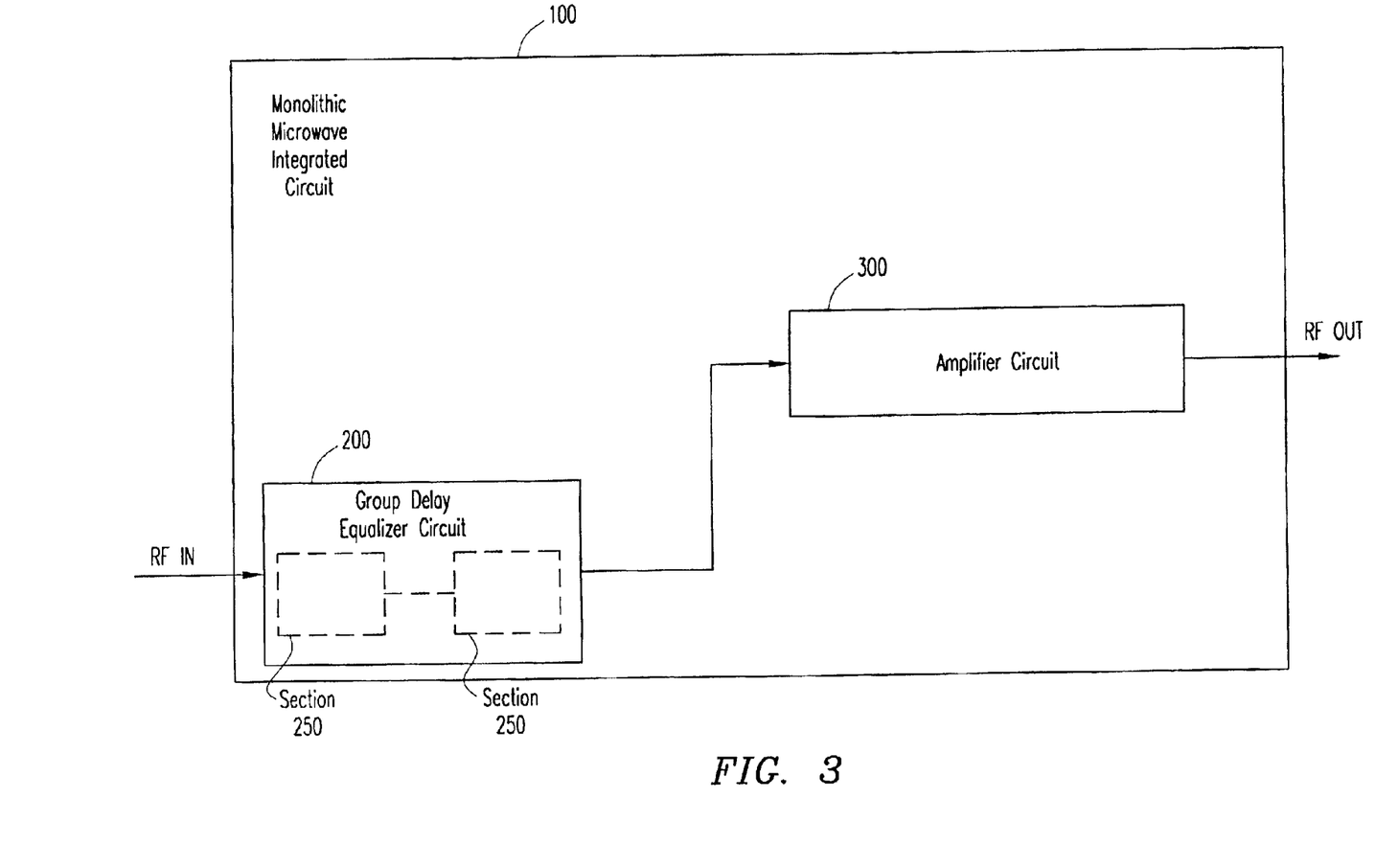
FIG. 3 is a block diagram of a monolithic microwave integrated circuit (MMIC) having a group delay equalizer circuit integrated with an amplifier circuit on the same MMIC.

In order to prevent distortion of pulses in distributed amplifier circuits, as shown in FIG. 3 and in accordance with embodiments of the present invention, a group delay equalizer circuit 200 and an amplifier circuit 300 (e.g., a distributed amplifier or feedback amplifier) can be integrated together on the same monolithic microwave integrated circuit (MMIC) 100 to achieve near constant delay at any given frequency. The group delay equalizer circuit 200 occupies a relatively small area (e.g., approximately 3 to 20 percent) of the MMIC 100, and thus only minimally increases the MMIC 100 cost. In addition, advantageously, the cost of the MMIC 100 with an integrated group delay equalizer circuit 200 is less than the cost for connecting the amplifier circuit 300 to external group delay equalizer circuitry.

As mentioned above, constant group delay will be essential in next-generation high data rate electro-optics hardware and electro-optics data links, to prevent distortion of data pulses. For example, electrical pulses in OC-192 (10 Gb/s) to OC-768 (40 Gb/s) electro-optics hardware can have bandwidths to 50 GHz or higher. Very wideband, near DC to 50 GHz or higher, microwave distributed amplifiers 300 are used to amplify these pulses. Therefore, in preferred embodiments, the group delay equalizer circuit 200 is capable of compensating for the group delay characteristics of the distributed amplifier circuit 300 to frequencies above 50 GHz. In addition, the use of the group delay equalizer circuit 200 integrated in MMICs 100 in next-generation electro-optics data links either improves the range of the data links or improves the signal-to-noise ratio and reduces the data bit errors for fixed length electro-optic data links.

It should be understood that the integrated group delay equalizer circuit 200 may be used with various types of amplifier circuits 300, which may contain common source field-effect transistors (FETs), bipolar transistors, a cascode FET arrangement or other type of transistor structure. In addition, the group delay equalizer circuit 200 may consist of one or more sections 250, each having a specific group delay response. For wideband distributed amplifier circuits 300, which must demonstrate constant group delay over a wide frequency range, at least two group delay equalizer circuit sections 250 are preferably cascaded together. Examples of group delay equalizer circuits 200 are described in U.S. Pat. No. 3,609,599 to Standley, U.S. Pat. No. 3,699,480 to Mueller, U.S. Pat. No. 3,737,808 to Srivastava, U.S. Pat. No. 4,443,772 to Schwarzmann, U.S. Pat. No. 4,491,808 to Saito, U.S. Pat. No. 4,730,342 to Saito, U.S. Pat. No. 5,004,991 to Teleki et al. and U.S. Pat. No. 5,721,756 to Liebetreu et al., all of which are hereby incorporated by reference.

The group delay equalizer circuit 200 is shown in FIG. 3 at the RF input of the amplifier circuit 300 to reduce power, voltage and current handling requirements of the components of the group delay equalizer circuit 200. Since the amplifier circuit 300 increases the signal power level, the power levels, voltages and currents are much higher at the output of the amplifier circuit 300 than at the input of the amplifier circuit 300. Therefore, larger group delay equalizer circuit 200 components would be required at the output of the amplifier circuit 300, as compared to the input of the amplifier circuit 300, to handle the higher power, voltage and current stress levels encountered at the output of the amplifier circuit 300.

However, the various sections of the group delay equalizer circuit 200 may be placed in any region of the MMIC 100. For example, one or more sections 250 of the group delay equalizer circuit 200 may be placed at the input portion of the amplifier circuit 300, one or more sections 250 of the group delay equalizer circuit 200 may be placed at the output portion of the amplifier circuit 300 and/or one or more sections 250 of the group delay equalizer circuit 200 may be placed within the amplifier circuit 300 chain itself, between transistor amplifier stages. It should be understood that regardless of where a particular group delay equalizer circuit section 250 is placed on the MMIC 100, the circuit topologies of the particular section 250 may still be the same (e.g., an all-pass filter with two inductors and two capacitors). However, the group delay equalizer circuit section 250 layout, component values and sizes may differ depending upon where the section 250 is placed on the MMIC 100.

Figure 4:
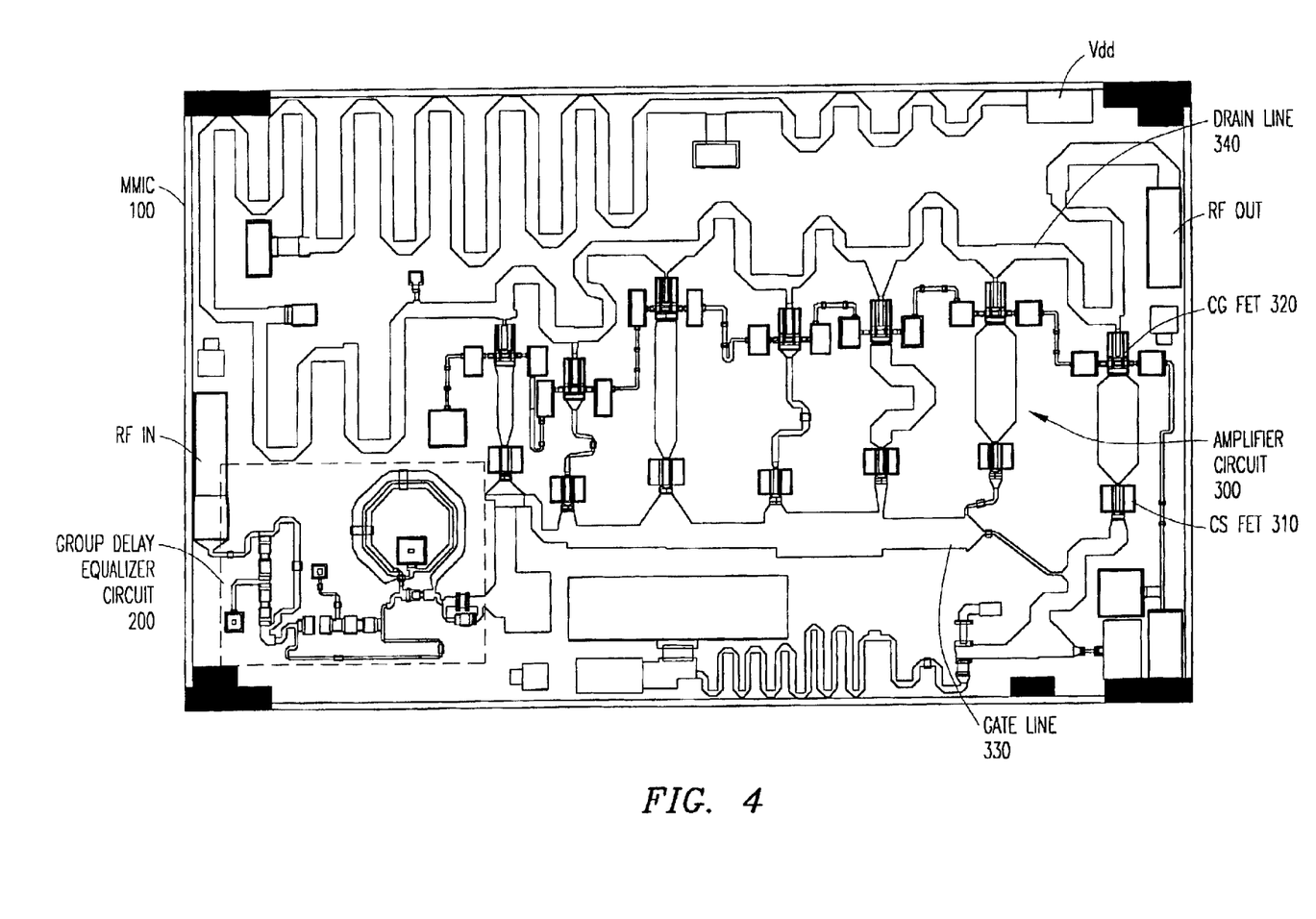
FIG. 4 is an exemplary layout of a MMIC having an integrated group delay equalizer circuit and distributed amplifier circuit.

An example of a MMIC 100 layout having an integrated group delay equalizer circuit 200 is shown in FIG. 4. The group delay equalizer circuit 200 is shown located in the bottom left corner of the MMIC 100 at the RF input to the MMIC 100 prior to a distributed amplifier circuit 300. The distributed amplifier circuit 300 is shown located from the middle to the right of the MMIC 100, terminating at the RF output of the MMIC 100. In FIG. 4, the group delay equalizer circuit 200 has four sections 250, each having a specific group delay response to compensate for the delay over a specific portion of the distributed amplifier circuit's 300 frequency range. The four sections 250 are more clearly visible in FIG. 6, which will be described in more detail hereinbelow.

The distributed amplifier circuit 300 is shown having seven microwave/mm-wave cascode FET stages 350 fabricated in a substrate, such as a III-V material substrate (e.g., gallium arsenide, gallium nitride or indium phosphide), II-VI material substrate or a heterostructure substrate (e.g., silicon germanium). Each cascode FET stage 350 has a common source (CS) FET 310 cascaded with a common gate (CG) FET 320. The CS FET 310 can be any type of FET structure, such as, for example, a reduced size FET of the type described in U.S. Pat. No. 6,081,006 to Nelson, which is hereby incorporated by reference.

It should be noted that for use in next-generation electro-optics applications, each of the group delay equalizer circuit 200 components must be carefully modeled and drawn to achieve operation to 50 GHz or higher. Therefore, electromagnetic simulator programs may need to be used to accurately analyze and optimize the group delay equalizer circuit 200 layouts.

As can be seen in FIG. 4, the group delay equalizer circuit 200 occupies a relatively small area on the MMIC 100, and yet enables the MMIC 100 to achieve a predicted, near-constant group delay variation, while maintaining a nearly flat gain. Therefore, the integration of the group delay equalizer circuit 200 with the distributed amplifier circuit 300 increases the overall amplifier cost by only a small amount, and allows a constant gain response to be achieved over a wide bandwidth while maintaining constant group delay.

As discussed above in connection with FIG. 3, it should be understood that although the group delay equalizer circuit sections 250 are inserted at the input to the MMIC 100 in FIG. 4, one or more of the group delay equalizer circuit sections 250 could be placed between stages 350 of the amplifier circuit 300, in the artificial gate and/or drain lines, or placed at the output of the amplifier circuit 350. There are advantages and disadvantages to placing the group delay equalizer circuit sections 250 in different regions of the MMIC 100.

For example, a disadvantage of placing the group delay equalizer circuit sections 250 at the MMIC 100 RF input is that the amplifier 300 noise figure is increased due to the insertion loss of the group delay equalizer circuit sections 250. A similar disadvantage of placing the group delay equalizer circuit sections 250 at the MMIC 100 RF output is that amplifier 300 output power is decreased due to the insertion loss of the group delay equalizer circuit sections 250. In addition, placing the group delay equalizer circuit sections 250 at the MMIC 100 RF output may also require additional design and layout work for the group delay equalizer circuit sections 250 so that the amplifier 300 can be properly biased.

Figure 5:
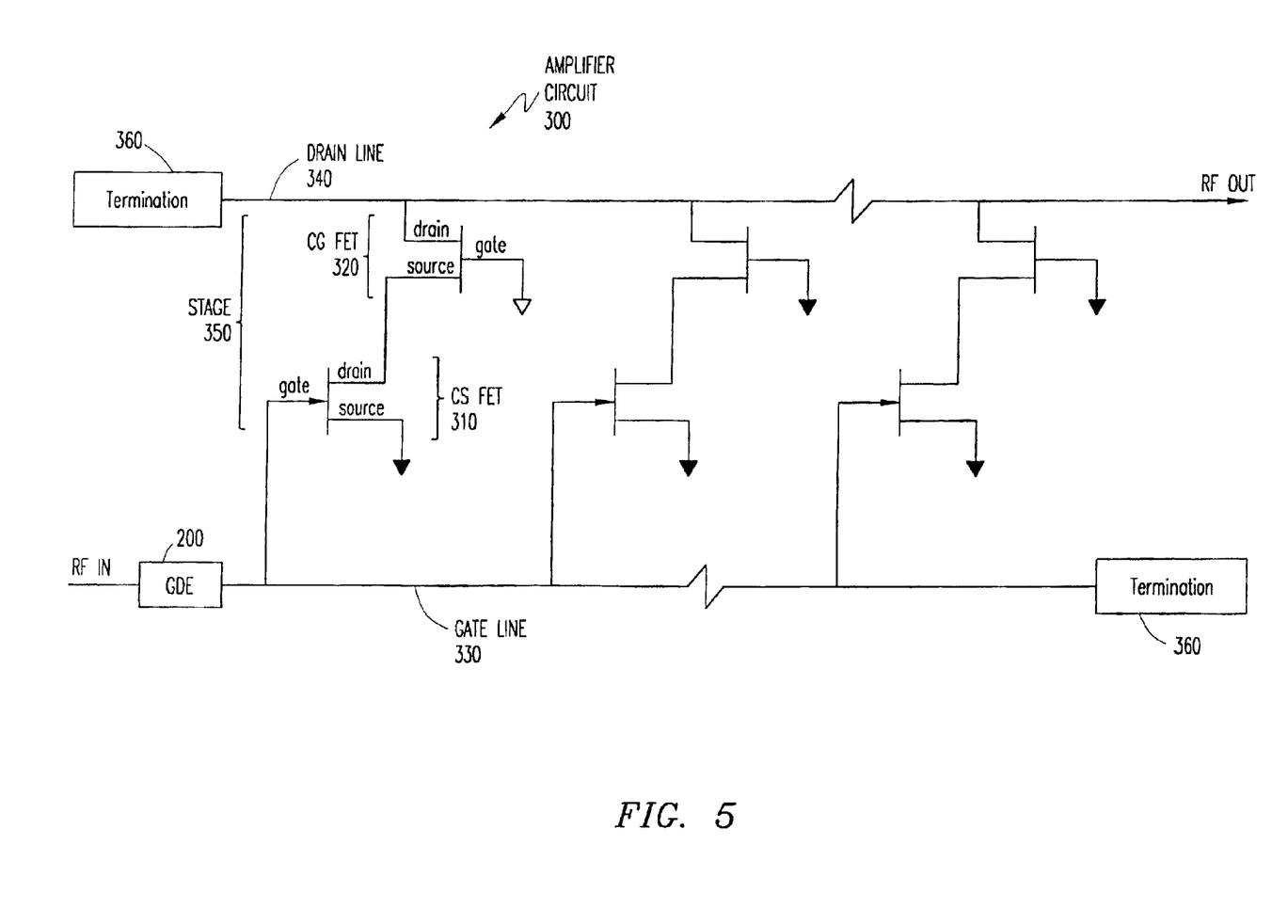
FIG. 5 is an exemplary circuit schematic of the distributed amplifier circuit shown in FIG. 4.

A circuit schematic of three stages 350 of the distributed cascode FET amplifier circuit 300 of FIG. 4 is shown in FIG. 5. However, it should be understood that any number of FET stages 350 can be used (e.g., from 2 to 10 or higher). In addition, any type of transistor structure, such as bipolar transistors or a cascode FET structure may be used. Typically, an RF input signal is sent down the "gate" line 330, from left to right, and is amplified by discrete cascode FET stages 350. In each cascode FET stage 350, the RF input is to the gate of the common source FET 310, and the RF output is from the drain of the common gate FET 320. The drain of the common source FET 310 interconnects with the source of the common gate FET 320. The source of the common source FET 310 is connected to ground. In most circuit applications, the gate of the common gate FET 320 is RF grounded, using capacitors to ground.

The RF out signals from each FET stage 350 combine ideally in phase along the drain line 340, summing towards the RF output of the amplifier 300 at the top right. Signals reaching the gate and drain line terminations 360 are absorbed by resistive loads. In a distributed amplifier 300, the FETs 310 and 320 provide the shunt capacitances of the artificial gate and drain transmission lines 330 and 340, respectively, and conductors (not shown) between the FETs stages 350 provide the inductive elements, to form an overall lossy transmission line for both the gate and drain networks.

Figure 6:
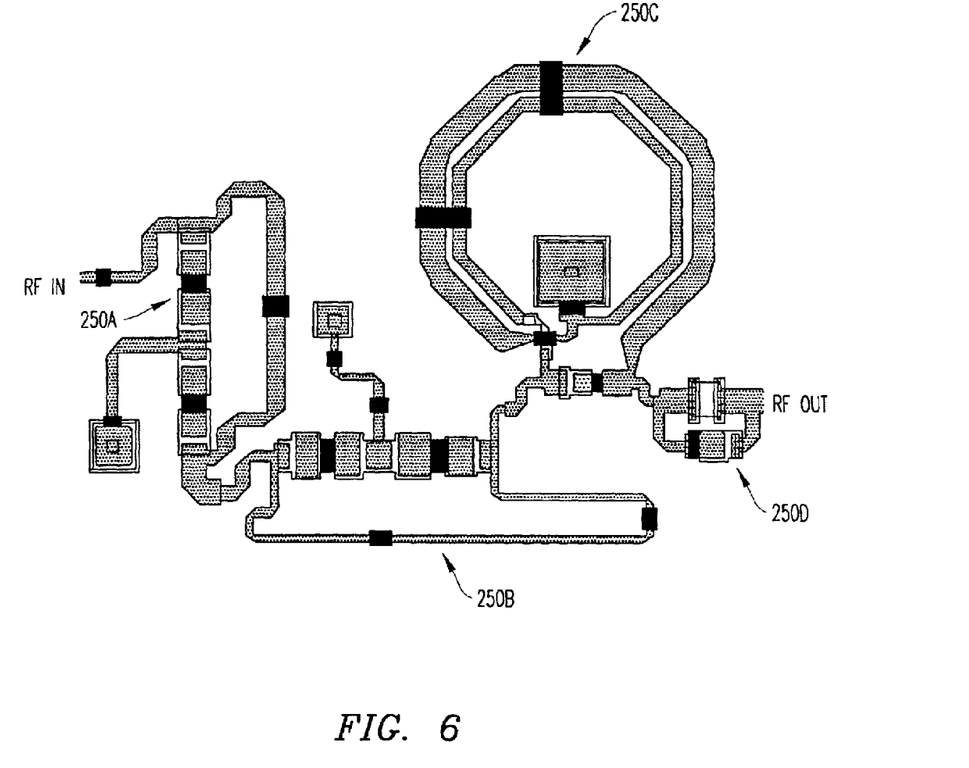
FIG. 6 is an exploded view of the group delay equalizer circuit shown in FIG. 4.

Referring now to FIG. 6, there is illustrated an exploded top view of the group delay equalizer circuit 200 layout. As can be seen, in the exemplary group delay equalizer circuit 200, there are four sections labeled 250A, 250B, 250C and 250D. Each section 250A–250D has a different group delay response, which when cascaded with the other sections, forms an overall composite group delay response. As discussed above, a wideband distributed amplifier has a phase response versus frequency, and the derivative of the phase response versus frequency is the group delay characteristic of the distributed amplifier. The composite group delay response of the group delay equalizer circuit 200 compensates for the group delay characteristic of the wideband distributed amplifier.

Most of the sections 250A–250D of the group delay equalizer circuit 200 are in microstrip form. Sections 250A–C all have a ground connection, illustrated as a small square, which represents a via (thru) metallized ground from top to bottom of the MMIC. The microstrip lines 210 in each of the sections 250A–250C are inductive over different frequency ranges. Each section 250A–250D also includes one or more metal-insulator-metal (MIM) capacitors 220. Inductors (L) show increasing impedance verses frequency, whereas capacitors (C) show decreasing impedance with frequency. Therefore, the inductors in the sections 250A–250C impede current flow of RF propagation at higher frequencies, and the capacitors 220 in the sections 250A–250D promote current flow of RF propagation at higher frequencies. Each of the L and C components results in either a phase "lag" or "lead", and combinations of these L and C components in filters (sections of the group delay equalizer circuit) create specific phase responses over a given frequency range.

Figure 7A:
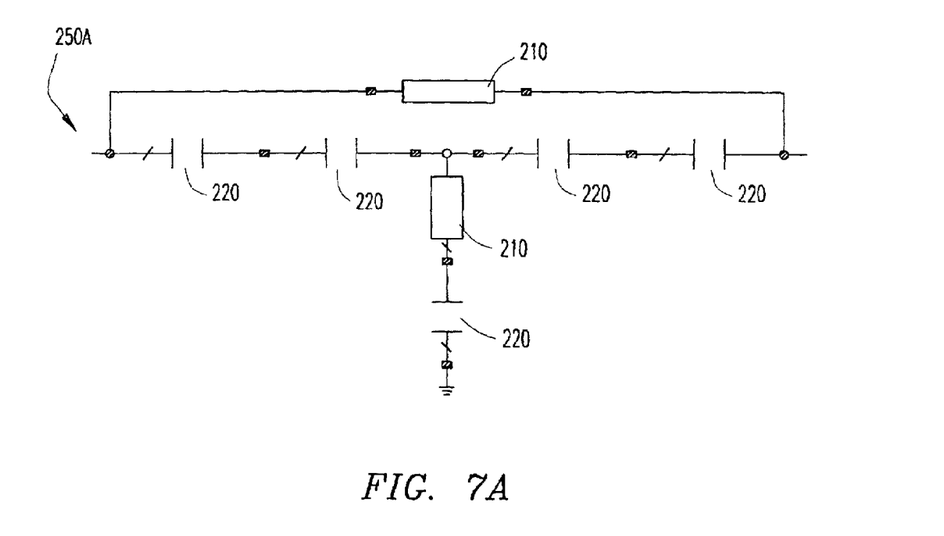
FIGS. 7A–7D are circuit schematics of each of the sections of the group delay equalizer circuit shown in FIG. 6.
Figure 7B:
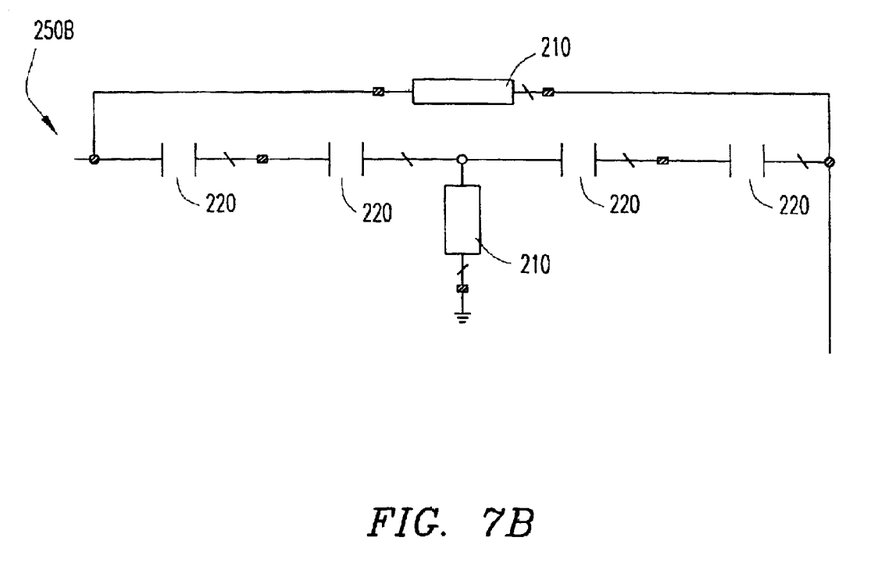
Figure 7C:
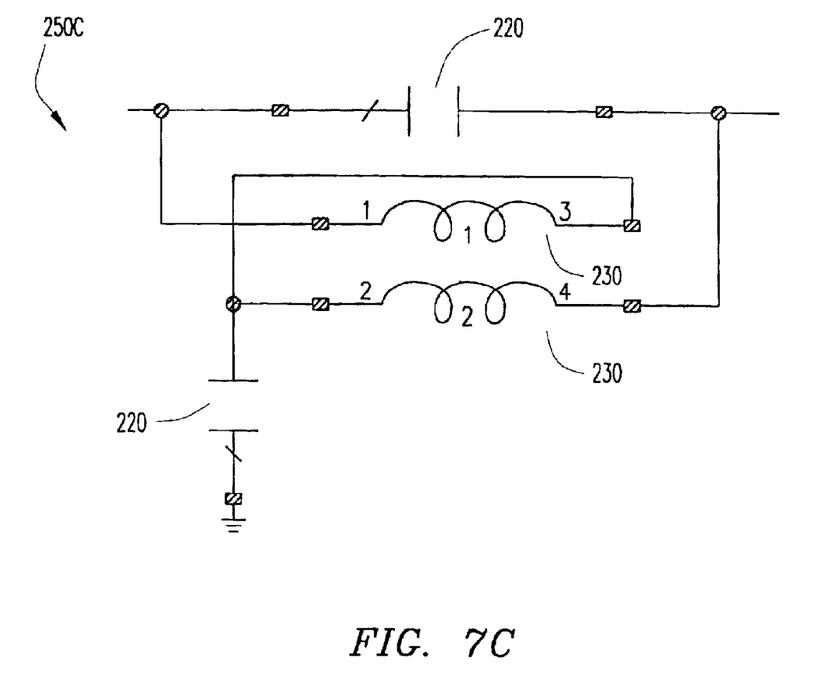
Figure 7D:
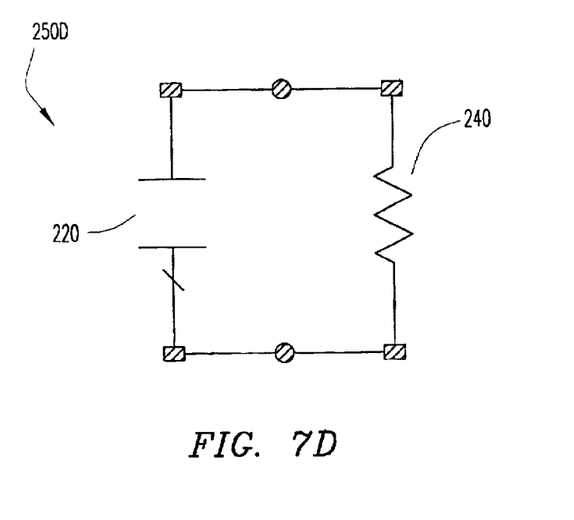

FIG. 6 will now be described in connection with FIGS. 7A–7D, which show circuit schematics of each of the sections of the group delay equalizer circuit 200 shown in FIG. 6. As shown in FIG. 7A, section 250A of the group delay equalizer circuit 200 is a bridged LC filter. As an example, the capacitor 220 values of section A are in the 0.22–0.45 pF range. Section 250B of the group delay equalizer circuit 200, as shown in FIG. 7B, is also a bridged LC filter. As an example, the capacitor 220 values of section B are in the 0.27–0.6 pF range. Section 250C of the group delay equalizer circuit 200, as shown in FIG. 7C, is a filter with a microstrip transformer. The transformer (shown as two coupled inductors 230 in FIG. 7C) includes coupled microstrip lines 210 in an overall octagonal shape. As an example, the capacitors 220 of section 250C are in the 0.1–1.2 pF range. Sections 250A, 250B and 250C each have a different group delay response. Section 250D, as shown in FIG. 7D, is an RC filter having a thin-film resistor 240 and MIM capacitor 220 connected in parallel. The RC filter is used primarily for adjusting the amplifier gain (amplitude) response over the lower frequency range of the amplifier circuit. Although the RC filter only has a small impact on the overall amplifier group delay response, the RC filter does have a different amplitude and phase response than sections 250A, 250B or 250C. However, it should be understood that any type of filter, including, for example, an LC filter or RLC filter, can be used for any of the sections 250A–250D.

Figure 8:
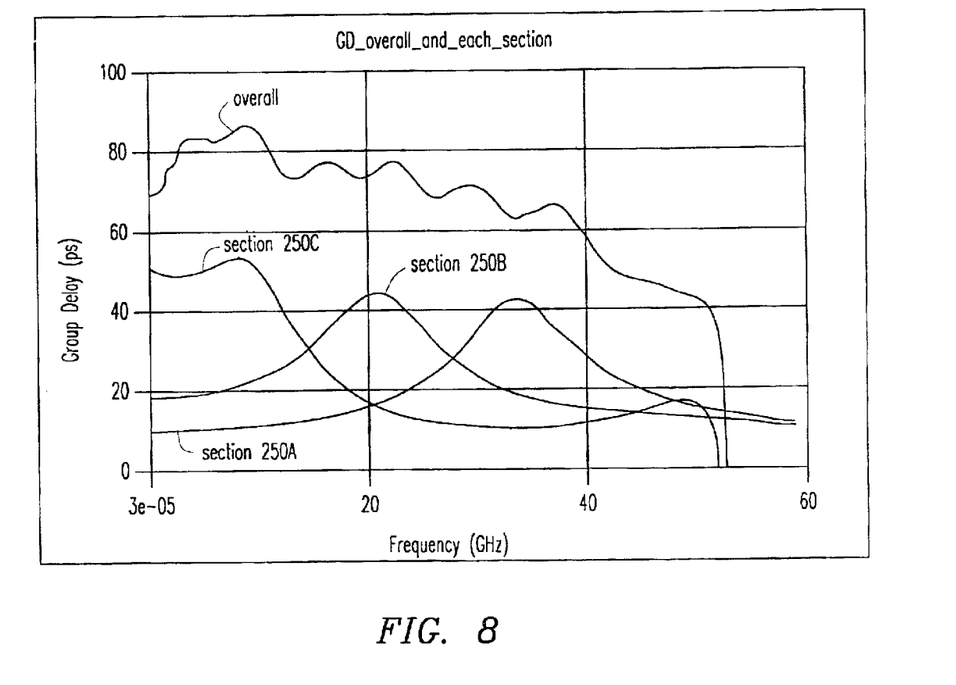
FIG. 8 is a graphical representation of the individual section group delay responses and composite group delay response of the group delay equalizer circuit sections shown in FIGS. 7A–7C.

The group delay responses for a cascade of group delay equalizer circuit sections similar to sections 250A–C shown in FIGS. 7A–7C are shown in FIG. 8. As can be seen in FIG. 8, each group delay equalizer circuit section has a different group delay response, which when cascaded with that of the other sections, forms an overall composite group delay response. The composite group delay response is used to compensate for the group delay characteristic of a wideband distributed amplifier.

Figure 9:
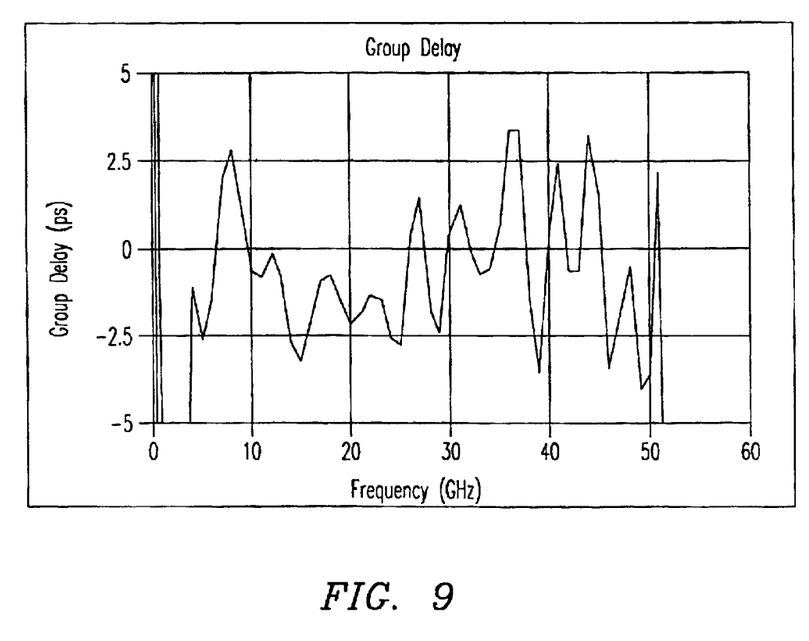
FIG. 9 is a graph illustrating the group delay variation verses frequency of the MMIC shown in FIG. 4.
Figure 10:
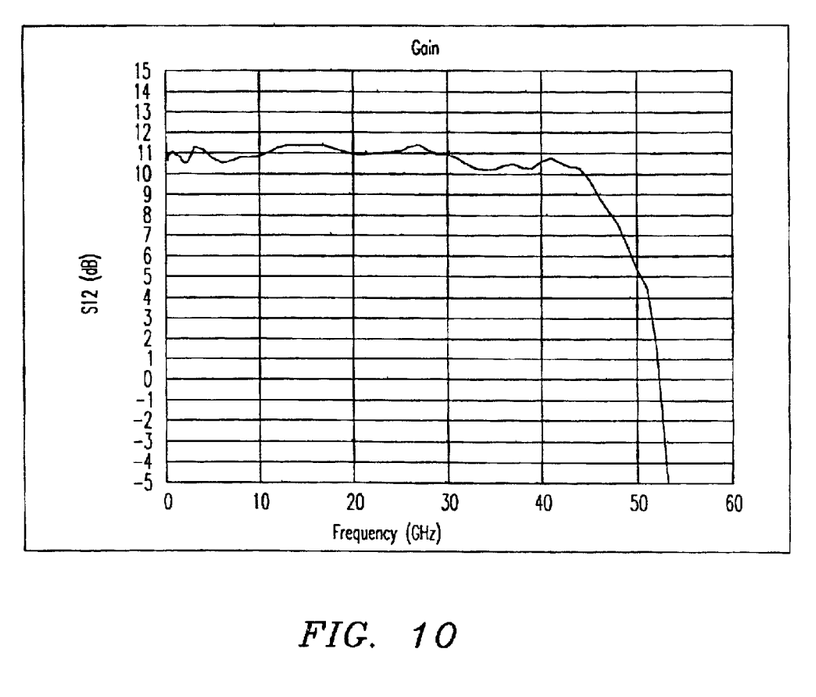
FIG. 10 is a graph illustrating the gain response of the MMIC shown in FIG. 4.

A predicted group delay response for a MMIC amplifier integrating a group delay equalizer circuit similar to the one shown in FIG. 6 is shown in FIG. 9. As can be seen in FIG. 9, the integration of the group delay equalizer circuit enables the MMIC to achieve a predicted group delay variation of +/−3.5 ps from 30 kHz to >50 GHz, while maintaining nearly flat gain of 10.8 dB to 43 GHz, as shown in FIG. 10. The predicted amplitude shown in FIG. 10 indicates that the amplifier would increase the power level of an RF signal or pulse entering it by a factor of ten (10).

Figure 11:
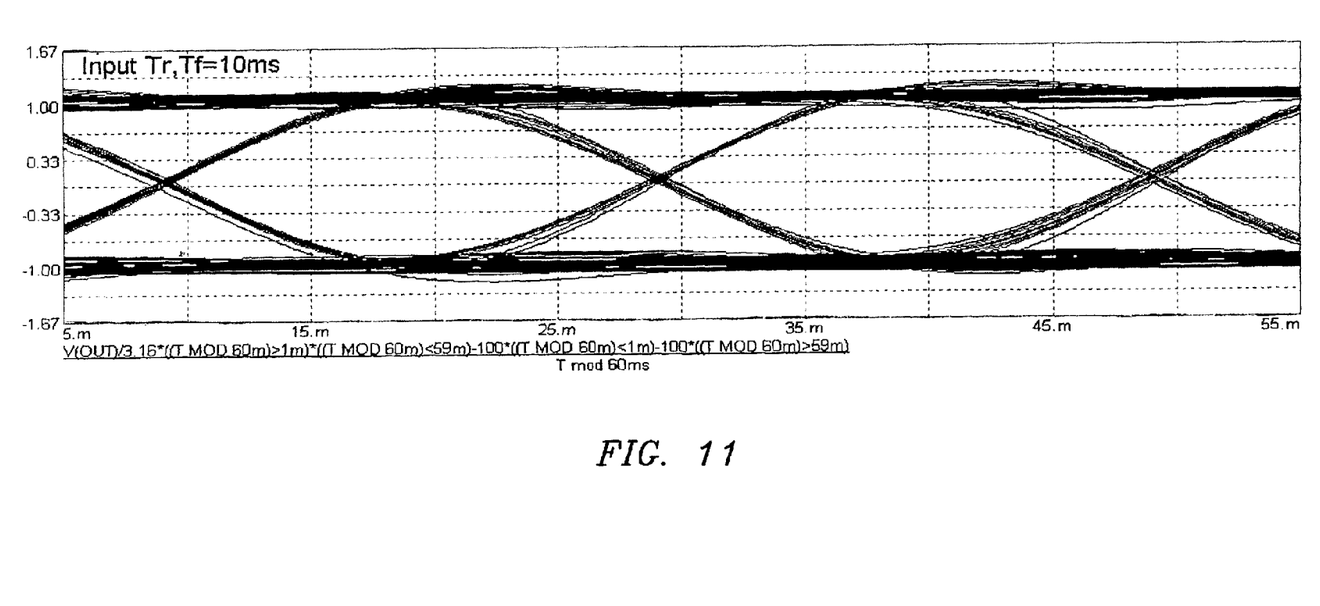
FIG. 11 is an eye diagram of the MMIC shown in FIG. 4.

FIG. 11 shows a predicted "eye diagram" for the MMIC distributed amplifier with integrated group delay equalizer. An eye diagram shows multiple pulse rising and falling edges effectively created by observing and recording all pulse responses (simulated) from the amplifier over a long time period for a pseudorandom data stream (bits of data –0, 1's) input. The "eye" opening in FIG. 11 is good, with little time jitter on pulse rising and falling edges. In addition, the opening allows receiver decision circuitry to judge between 0s and 1's. Therefore, as can be seen in FIG. 11, where amplifier group delay is constant versus frequency over a bandwidth adequate to reproduce the pulse data stream, the resulting eye diagram produced is an open eye with low time jitter. Clearly defined eye diagrams are important in achieving low bit error rates for electro-optic transceivers or fiber links.

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

What is claimed is:

1. A monolithic microwave integrated circuit, comprising:
    an amplifier circuit having a group delay variation verses frequency characteristic; and
    a group delay equalizer circuit integrated with said amplifier circuit to compensate for said group delay variation verses frequency characteristic of said amplifier circuit to frequencies above 50 GHz.

2. The circuit of claim 1, wherein said amplifier circuit is capable of receiving an input signal having a frequency range, amplifying said input signal and producing an output signal corresponding to said amplified input signal, said group delay equalizer circuit being further capable of maintaining near constant group delay of frequencies within said frequency range of said input signal to prevent distortion of said output signal.

3. The circuit of claim 1, wherein said group delay equalizer circuit comprises between 3 and 20 percent of the area of said monolithic microwave integrated circuit.

4. The circuit of claim 1, wherein said amplifier circuit is a distributed amplifier circuit.

5. The circuit of claim 4, wherein said distributed amplifier circuit comprises one or more stages, each of said one or more stages including a common source field-effect transistor, a bipolar transistor or a cascode field-effect transistor structure.

6. The circuit of claim 1, wherein said amplifier circuit is a feedback amplifier circuit.

7. The circuit of claim 1, wherein said group delay equalizer circuit comprises one or more sections, each of said sections having a different group delay response.

8. The circuit of claim 7, wherein at least one of said one or more sections is placed at the input of said amplifier circuit.

9. The circuit of claim 7, wherein at least one of said one or more sections is placed at the output of said amplifier circuit.

10. The circuit of claim 7, wherein at least one of said one or more sections is placed between one or more stages of said amplifier circuit.

11. The circuit of claim 7, wherein said one or more sections are cascaded together to form a composite group delay response capable of compensating for said group delay variation verses frequency characteristic of said amplifier circuit.

12. The circuit of claim 7, wherein at least one of said one or more sections has least one microstrip line inductive over a specific frequency range and at least one capacitor to create a specific phase response over at least a portion of the frequency range of said amplifier circuit.

13. The circuit of claim 12, wherein at least one of said one or more sections is a filter selected from the group consisting of: an LC filter, a bridged LC filter, an RC filter and an RLC filter.

14. The circuit of claim 12, wherein at least one of said one or more sections is a filter with a microstrip transformer.

15. The circuit of claim 1, further comprising:
    a substrate, said amplifier circuit and said group delay equalizer circuit being fabricated in said substrate.

16. The circuit of claim 15, wherein said substrate is made from a material selected from the group consisting of: a III-V material, a II-VI material and a heterostructure material.

17. The circuit of claim 1, wherein said group delay equalizer circuit is further capable of allowing a near constant gain response to be achieved over the frequency range of said amplifier circuit.

18. A method for providing a near constant group delay over a frequency range of a amplifier circuit, comprising the steps of:
    providing said amplifier circuit within a monolithic microwave integrated circuit, said amplifier circuit having a group delay response variation verses frequency characteristic; and
    integrating a group delay equalizer circuit with said amplifier circuit on said monolithic microwave integrated circuit to compensate for said group delay variation verses frequency characteristic of said amplifier circuit to frequencies above 50 GHz.

19. The method of claim 18, further comprising the steps of:
    receiving an input signal having a frequency range at said amplifier circuit;
    amplifying said input signal to produce an output signal corresponding to said amplified input signal; and
    maintaining, by said group delay equalizer circuit, near constant group delay of frequencies within said frequency range of said input signal to prevent distortion of said output signal.

20. The method of claim 18, wherein said group delay equalizer circuit comprises between 3 and 20 percent of the area of said monolithic microwave integrated circuit.

21. The method of claim 18, wherein said step of integrating further comprises the step of:

integrating one or more sections of said group delay equalizer circuit with said amplifier circuit on said monolithic microwave integrated circuit, each of said sections having a different group delay response.

22. The method of claim 21, wherein said step of integrating said one or more sections further comprises the step of:

placing at least one of said one or more sections at the input of said amplifier circuit.

23. The method of claim 21, wherein said step of integrating said one or more sections further comprises the step of:

placing at least one of said one or more sections at the output of said amplifier circuit.

24. The method of claim 21, wherein said step of integrating said one or more sections further comprises the step of:

placing at least one of said one or more sections between one or more stages of said amplifier circuit.

25. The method of claim 21, wherein said step of integrating said one or more sections further comprises the step of:

cascading said one or more sections together to form a composite group delay response capable of compensating for said group delay variation verses frequency characteristic of said amplifier circuit.

26. The method of claim 18, wherein said step of integrating further comprises the step of:

integrating said group delay equalizer circuit with said amplifier circuit on said monolithic microwave integrated circuit to allow a near constant gain response to be achieved over the frequency range of said amplifier circuit.

27. A monolithic microwave integrated circuit, comprising:

an amplifier circuit having a group delay variation verses frequency characteristic; and a group delay equalizer circuit integrated with said amplifier circuit to compensate for said group delay variation verses frequency characteristic of said amplifier circuit, said group delay equalizer circuit comprising a plurality sections, each section having a different group delay response, said plurality of sections being cascaded to form an overall composite group delay response.

28. The monolithic microwave integrated circuit of claim 27, wherein said amplifier circuit has a plurality of stages.

29. The monolithic microwave integrated circuit of claim 28, wherein said plurality of sections can be separated by said plurality of stages.

30. The monolithic microwave integrated circuit of claim 27, wherein said group delay equalizer circuit is capable of compensating for said group delay variation verses frequency characteristic of said amplifier circuit to frequencies above 50 GHz.

* * * * *